(12) United States Patent
An

(10) Patent No.: US 9,117,781 B2
(45) Date of Patent: *Aug. 25, 2015

(54) ORGANIC LIGHT EMITTING DIODE DISPLAY AND METHOD FOR MANUFACTURING THE SAME

(71) Applicant: Samsung Display Co., LTD., Yongin, Gyeonggi-Do (KR)

(72) Inventor: Chi-Wook An, Yongin (KR)

(73) Assignee: Samsung Display Co., LTD., Yongin (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/568,034

(22) Filed: Dec. 11, 2014

(65) Prior Publication Data

US 2015/0137105 A1 May 21, 2015

Related U.S. Application Data

(62) Division of application No. 13/416,448, filed on Mar. 9, 2012, now Pat. No. 8,940,613.

(30) Foreign Application Priority Data

Aug. 30, 2011 (KR) .................. 10-2011-0087207

(51) Int. Cl.
*H01L 51/00* (2006.01)
*H01L 27/32* (2006.01)

(52) U.S. Cl.
CPC ........ *H01L 27/3258* (2013.01); *H01L 27/3265* (2013.01)

(58) Field of Classification Search
CPC .................................. H01L 27/3265
USPC ........ 438/393–395, 34; 257/40, 91, E51.018, 257/E21.008, 532, 534, E29.342, E29, 343; 361/306.1, 306.3
See application file for complete search history.

(56) References Cited

U.S. PATENT DOCUMENTS

| | | | |
|---|---|---|---|
| 4,800,415 A | 1/1989 | Simmons et al. | |
| 6,496,363 B1 | 12/2002 | Li | |
| 6,498,363 B1 | 12/2002 | Kao et al. | |
| 8,378,352 B2 * | 2/2013 | Lee et al. | 257/59 |
| 8,624,246 B2 * | 1/2014 | You | 257/59 |
| 8,629,448 B2 * | 1/2014 | Kang et al. | 257/72 |
| 8,698,147 B2 * | 4/2014 | Choi et al. | 257/59 |
| 8,698,189 B2 * | 4/2014 | Park et al. | 257/99 |

(Continued)

FOREIGN PATENT DOCUMENTS

| | | |
|---|---|---|
| KR | 10-2008-0065334 A | 7/2008 |
| KR | 10-2009-0105649 A | 10/2009 |

(Continued)

*Primary Examiner* — Fernando L Toledo
*Assistant Examiner* — Victoria K Hall
(74) *Attorney, Agent, or Firm* — Knobbe Martens Olson & Bear, LLP

(57) ABSTRACT

An organic light emitting diode display includes a substrate; a first capacitor electrode provided over the substrate and including polysilicon; an insulating layer provided over the first capacitor electrode; and a second capacitor electrode provided over the insulating layer and including a first lower metal layer overlapping with the first capacitor electrode and a first upper metal layer. The first upper metal layer includes a doping opening configured to expose at least a portion of the first lower metal layer.

12 Claims, 13 Drawing Sheets

(56) References Cited

U.S. PATENT DOCUMENTS

| | | | |
|---|---|---|---|
| 8,710,527 B2 * | 4/2014 | Moon et al. | 257/98 |
| 8,742,404 B2 | 6/2014 | Choi et al. | |
| 8,766,265 B2 | 7/2014 | Lee et al. | |
| 8,822,999 B2 * | 9/2014 | Choi et al. | 257/59 |
| 8,873,014 B2 * | 10/2014 | Her et al. | 349/151 |
| 8,890,287 B2 * | 11/2014 | Wang | 257/532 |
| 8,933,451 B2 * | 1/2015 | Kim et al. | 257/59 |
| 8,937,315 B2 * | 1/2015 | Kwon et al. | 257/71 |
| 8,981,361 B2 * | 3/2015 | Ohuchi et al. | 257/40 |
| 8,987,725 B2 * | 3/2015 | Kang et al. | 257/40 |
| 2008/0315189 A1 | 12/2008 | Lee et al. | |
| 2009/0224257 A1 | 9/2009 | Chin et al. | |
| 2010/0193790 A1 | 8/2010 | Yeo et al. | |
| 2010/0207121 A1 | 8/2010 | Hino et al. | |
| 2011/0140107 A1 | 6/2011 | Kang et al. | |
| 2011/0240999 A1 | 10/2011 | You | |
| 2014/0124769 A1 | 5/2014 | Kang et al. | |

FOREIGN PATENT DOCUMENTS

| | | |
|---|---|---|
| KR | 10-2011-0037408 A | 4/2011 |
| KR | 10-1032603 B1 | 5/2011 |

* cited by examiner

ORGANIC LIGHT EMITTING DIODE DISPLAY AND METHOD FOR MANUFACTURING THE SAME

RELATED APPLICATIONS

This application is a divisional of U.S. patent application Ser. No. 13/416,448, filed Mar. 9, 2012, which claims priority to Korean Patent Application No. 10-2011-0087207 filed in the Korean Intellectual Property Office on Aug. 30, 2011. The disclosures of the U.S. patent application Ser. No. 13/416,448 and the Korean Patent Application No. 10-2011-0087207 are incorporated herein by reference in their entirety.

BACKGROUND

1. Field

The present disclosure relates generally to an organic light emitting diode (OLED) display.

2. Description of the Related Technology

An organic light emitting diode (OLED) display is a self emissive display device that displays images with organic light emitting diodes. Unlike the liquid crystal display (LCD), the organic light emitting diode (OLED) display does not require a separate light source, thereby making it possible to be implemented as a slim and lightweight display. Furthermore, as the organic light emitting diode display has high quality characteristics such as lower power consumption, high luminance, and short response time, it has been spotlighted as a next generation display device.

Organic light emitting diode displays are classified as passive matrix and active matrix types depending upon the driving method. With the active matrix type of organic light emitting diode display, an organic light emitting diode, a thin film transistor (TFT), and a capacitor are formed for each of the pixels so as to control each pixel in an independent manner.

The capacitor may be formed simultaneously with the thin film transistor. For example, both electrodes of the capacitor may be formed simultaneously with a semiconductor layer and a gate electrode of the thin film transistor, respectively. In this instance, the semiconductor layer and one of the two electrodes of the capacitor include an impurity-doped polycrystalline silicon layer.

Meanwhile, in order to form one of the capacitor electrodes with an impurity-doped silicon layer, it is required to provide a separate doping masking process for forming the electrode, and this involves complicated processing steps and increased production cost.

The above information disclosed in this Background section is only for enhancement of understanding of the background of the described technology and therefore it may contain information that does not form the prior art that is already known in this country to a person of ordinary skill in the art.

SUMMARY

An aspect of the present invention provides a manufacturing method for simplifying a process for manufacturing an organic light emitting diode (OLED) display.

Another aspect of the present invention provides an organic light emitting diode (OLED) display for increasing efficiency of a capacitor of an organic light emitting diode (OLED) display.

An embodiment provides an organic light emitting diode display including: a substrate; a first capacitor electrode provided over the substrate and comprising polysilicon; an insulating layer provided over the first capacitor electrode; and a second capacitor electrode provided over the insulating layer such that the insulating layer is interposed between the first and second capacitor electrodes and including a first lower metal layer overlapping with the first capacitor electrode and a first upper metal layer, wherein the first upper metal layer includes a doping opening configured to expose at least a portion of the first lower metal layer.

Conductive impurity ions may be doped to the first capacitor electrode in a region corresponding to the doping opening.

The organic light emitting diode display may further include: a semiconductor provided over the substrate and including a source region, a drain region, and a channel region; and a gate electrode provided over the insulating layer overlapping with the channel region, and including a second lower metal layer and a second upper metal layer, wherein the second lower metal layer is made of the same material as the first lower metal layer and wherein the second upper metal layer is made of the same material as the first upper metal layer.

The conductive impurity ions may be doped to the source region and the drain region.

The organic light emitting diode display may further include: an interlayer insulating layer provided over the second capacitor electrode and the gate electrode; a source electrode and a drain electrode provided over the interlayer insulating layer and connected to the source region and the drain region; a planarization layer provided over the source electrode and the drain electrode; a pixel electrode provided over the planarization layer; a pixel defining layer having a pixel opening exposing the pixel electrode; an organic light emission layer provided over the pixel opening; and a common electrode provided over the organic light emission layer.

The pixel electrode may be connected to the source electrode or the drain electrode.

The thickness of the first lower metal layer may be equal to or less than about 1000 Å.

The thickness of the first upper metal layer may be twice to four times the thickness of the first lower metal layer.

The width of the doping opening may be equal to or less than about 2 μm.

The doping opening may have a circular or polygonal shape.

The first upper metal layer may include a plurality of stick-shaped branches, and wherein the doping opening may include a channel that is provided between two neighboring branches.

The first upper metal layer may comprise a circular or polygonal ring which includes the doping opening.

Another embodiment provides a method for manufacturing an organic light emitting diode display, including: forming a first silicon pattern and a second silicon pattern over a substrate; forming an insulating layer over the first silicon pattern and the second silicon pattern; forming a first metal layer and a second metal layer over the insulating layer; forming a photoresist pattern over the second metal layer; dry-etching the second metal layer by using the photoresist pattern to form a first upper metal layer and a second upper metal layer; wet-etching the first metal layer using the photoresist pattern to form a first lower metal layer and a second lower metal layer; doping conductive impurity ions to the first silicon pattern and the second silicon pattern to form a semiconductor including a source region, a drain region, and a channel region and a first capacitor electrode; forming an interlayer insulating layer over the semiconductor and the first capacitor electrode; forming a source electrode and a drain electrode respectively connected to the source region and the drain region, respectively, over the interlayer insulating layer; forming a planarization layer over the source electrode and the drain electrode; and forming a pixel electrode over the planarization layer, wherein the first upper metal layer includes a doping opening exposing the first lower metal layer, and wherein the conductive impurity ions are doped to the second silicon pattern through the doping opening.

The second lower metal layer and the second upper metal layer may overlap with the channel region.

The width of the doping opening may be equal to or less than about 2 μm.

The thickness of the first metal layer may be equal to or less than about 1000 Å.

The thickness of the second metal layer may be twice to four times the thickness of the first metal layer.

The doping opening may have a circular or polygonal shape.

The first upper metal layer may include a plurality of stick-shaped branches, and the doping opening may comprise a channel that is provided between two neighboring branches.

The first upper metal layer may comprise a circular or polygonal ring which includes the doping opening.

According to embodiments, the doping region of the transistor and the doping region of the capacitor can be formed by performing the masking process once, thereby simplifying the manufacturing process.

When the doping process is performed as described in the embodiments, the capacitor with the MIM configuration having better efficiency than the MOS configuration can be easily formed.

DETAILED DESCRIPTION

Figure 1:
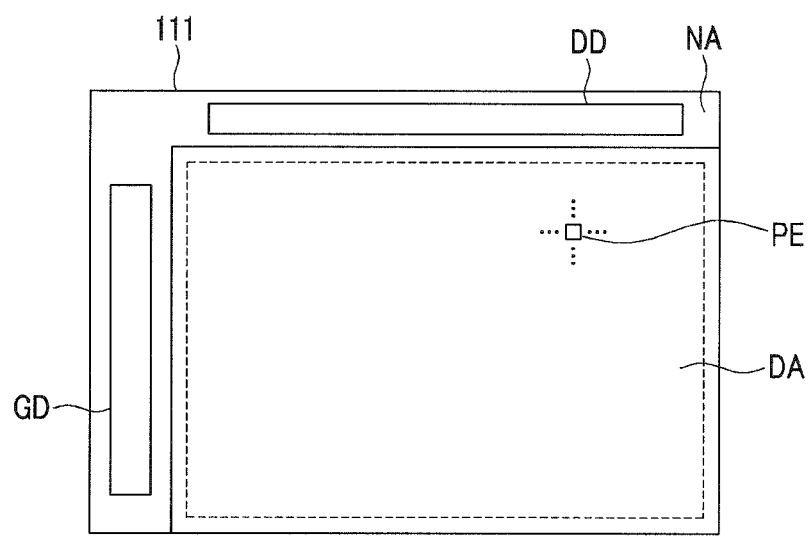
FIG. 1 shows a top plan view of an organic light emitting diode (OLED) display according to an embodiment.

The present invention will be described more fully hereinafter with reference to the accompanying drawings in which embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being on another element, it can be directly on the other element or intervening elements may also be present. In contrast, when an element is referred to as being "directly on" another element, there are no intervening elements present.

An organic light emitting diode (OLED) display according to embodiments will now be described with reference to accompanying drawings.

Figure 2:
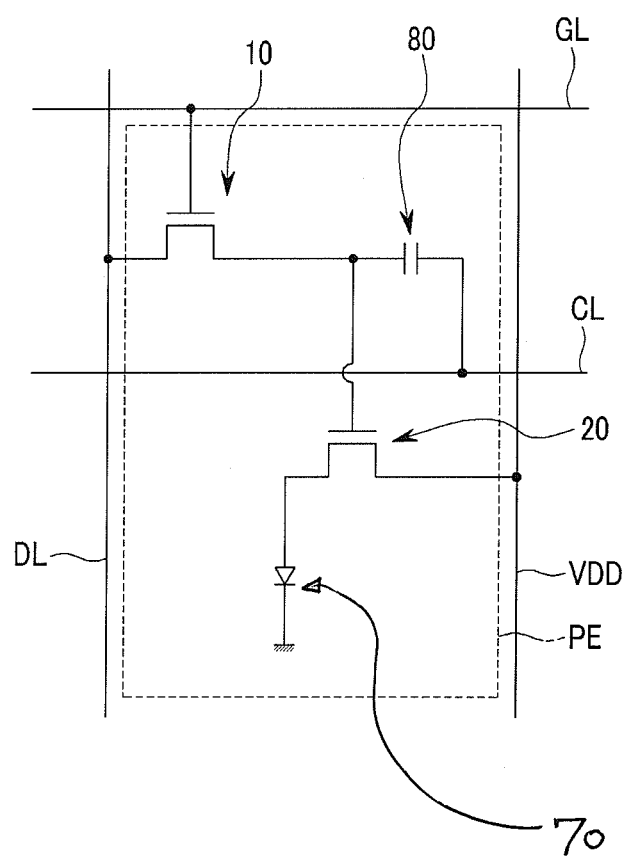
FIG. 2 shows a circuit diagram of a pixel circuit of an organic light emitting diode (OLED) display of FIG. 1.

FIG. 1 shows a top plan view of an organic light emitting diode (OLED) display according to an embodiment. FIG. 2 shows a circuit diagram of a pixel circuit of an organic light emitting diode (OLED) display of FIG. 1.

As shown in FIG. 1, the organic light emitting diode (OLED) display includes a substrate 111 including a display area (DA) and a non-display area (NA). A plurality of pixels (PE) are formed in the display area (DA) of the substrate 111 to display an image, and at least one driving circuit (GD, DD) is formed in the non-display area (NA).

As shown in FIG. 2, a pixel (PE) has a 2Tr-1 Cap structure including an organic light emitting diode 70, two thin film transistors (TFTs) 10 and 20, and a capacitor 80. However, the embodiment is not limited thereto. In another embodiment, the organic light emitting diode (OLED) display 101 can include at least three thin film transistors and at least two capacitors for each pixel (PE), and it can be configured to have various configurations by forming an additional wire. The additionally formed thin film transistors and capacitors can configure a compensation circuit.

The compensation circuit improves uniformity of the organic light emitting diode 70 formed for each pixel (PE) to control deviation of image quality. The compensation circuit generally includes two to eight thin film transistors.

Also, the driving circuit (GD, DD) formed in the non-display area (NA) of the substrate 111 can include an additional thin film transistor.

The organic light emitting diode 70 includes an anode that is a hole injection electrode, a cathode that is an electron injection electrode, and an organic light emission layer disposed between the anode and the cathode.

In the embodiment, a single pixel (PE) includes a first thin film transistor 10 and a second thin film transistor 20.

The first thin film transistor 10 and the second thin film transistor 20 respectively include a gate, a semiconductor layer, a source, and a drain. The semiconductor layer of at least one of the first thin film transistor 10 and the second thin film transistor 20 includes an impurity-doped polysilicon film. That is, at least one of the first thin film transistor 10 and the second thin film transistor 20 is a polysilicon thin film transistor.

FIG. 2 shows a gate line (GL), a data line (DL), a common power line (VDD), and a capacitor line (CL), and the capacitor line (CL) can be omitted.

The source of the first thin film transistor 10 is connected to the data line (DL), and the gate of the first thin film transistor 10 is connected to the gate line (GL). The drain of the first thin film transistor 10 is connected to the capacitor line (CL) through the capacitor 80. A node is formed between the drain of the first thin film transistor 10 and the capacitor 80 so the gate of the second thin film transistor 20 is connected to the node. The common power line VDD is connected to the source of the second thin film transistor 20, and the anode of the organic light emitting diode 70 is connected to the drain.

The first thin film transistor 10 is used as a switch for selecting a pixel (PE) to emit light. The first thin film transistor 10 is instantly turned on and the capacitor 80 is charged, and in this instance, the stored amount of the charge is proportional to a potential of a voltage applied from the data line (DL). When a signal for increasing the voltage for each frame period is input to the capacitor line (CL) while the first thin film transistor 10 is turned off, a gate potential of the second thin film transistor 20, with reference to the potential charged in the capacitor 80, rises according to the voltage that is applied through the capacitor line (CL). The second thin film transistor 20 is turned on when the gate potential exceeds a threshold voltage. The voltage applied to the common power line VDD is applied to the organic light emitting diode 70 through the second thin film transistor 20 and the organic light emitting diode 70 emits light.

An organic light emitting diode (OLED) display according to an embodiment will now be described with reference to FIG. 3.

Figure 3:
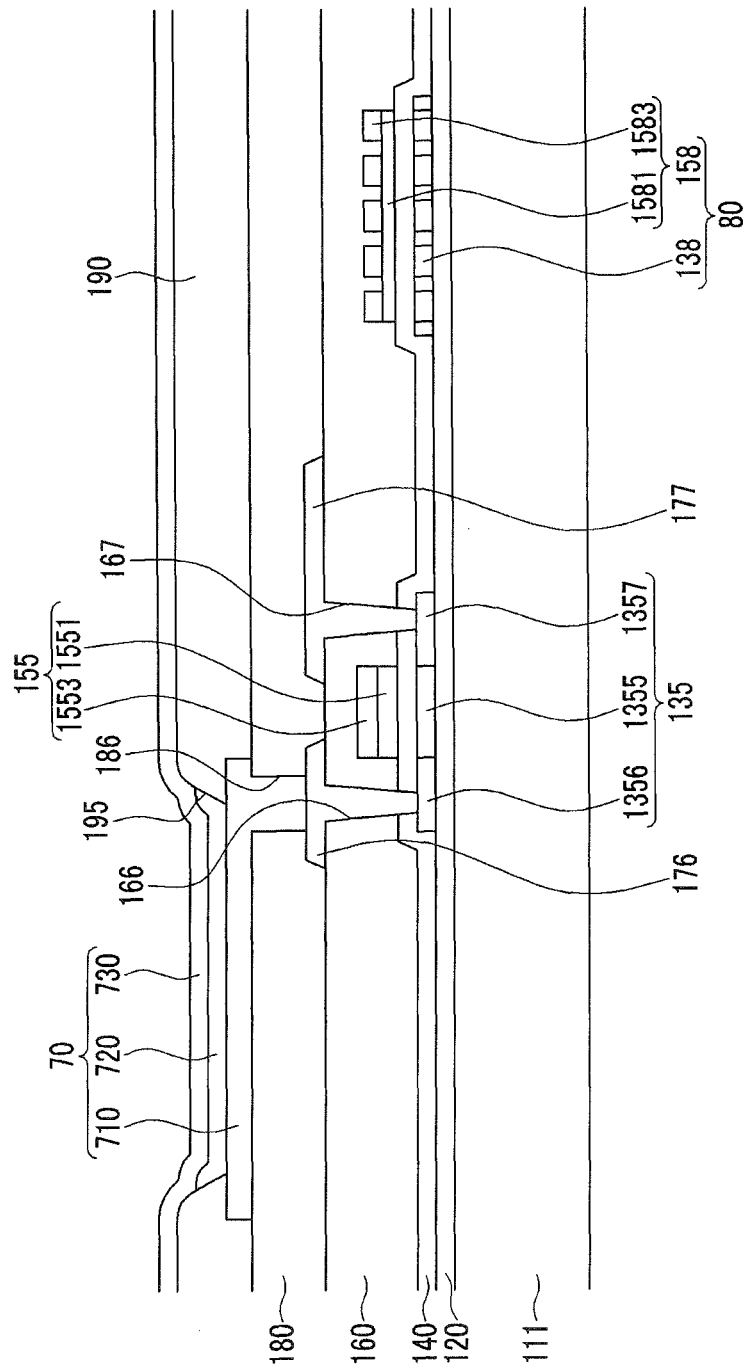
FIG. 3 shows a cross-sectional view of a partially magnified part of an organic light emitting diode (OLED) display of FIG. 1.

FIG. 3 shows a cross-sectional view of a partially magnified part of an organic light emitting diode (OLED) display of FIG. 1.

A configuration of the second thin film transistor 20 and the capacitor 80 of FIG. 1 will be described in detail according to their stacked order. The second thin film transistor 20 will be called a thin film transistor hereinafter.

The substrate 111 may be an insulating substrate made of glass, quartz, ceramic, or plastic, and the substrate 111 may be a metallic substrate made of stainless steel.

A buffer layer 120 is disposed on the substrate 111.

The buffer layer 120 may be formed of a single layer made of silicon nitride (SiNx) or a dual layer structure in which silicon nitride (SiNx) and silicon oxide (SiO2) are stacked. The buffer layer 120 prevents unnecessary elements such as impurity elements or moisture from penetrating, and simultaneously planarizes the surface.

A semiconductor 135 made of polysilicon and a first capacitor electrode 138 are disposed on the buffer layer 120.

The semiconductor 135 includes a channel region 1355, and a source region 1357 and a drain region 1356 formed on both sides of the channel region 1355. The channel region 1355 of the semiconductor 135 includes polysilicon to which no impurity is doped, such that it is an intrinsic semiconductor. The source region 1357 and the drain region 1356 of the semiconductor 135 include polysilicon to which a conductive impurity is doped, such that it is an impurity semiconductor.

The first capacitor electrode 138 includes a region to which a conductive impurity is doped and another region to which no conductive impurity is doped. The regions to which the conductive impurity is doped corresponds to voids or openings formed in the first upper metal layer 1583 to be described, and the regions to which no conductive impurity is doped corresponds to non-opened portions of the first upper metal layer 1583.

The impurity doped to the source region 1357, the drain region 1356, and the first capacitor electrode 138 may be one of a p-type impurity and an n-type impurity.

A gate insulating layer 140 is disposed on the semiconductor 135 and the first capacitor electrode 138. The gate insulating layer 140 may be a single layer or multiple layers including at least one of tetraethyl orthosilicate (TEOS), silicon nitride, and silicon oxide.

A gate electrode 155 and a second capacitor electrode 158 are disposed on the gate insulating layer 140. The gate electrode 155 overlaps with the channel region 1355, and the second capacitor electrode 158 overlaps with the first capacitor electrode 138.

The second capacitor electrode 158 includes a first lower metal layer 1581 and a first upper metal layer 1583, and the gate electrode 155 includes a second lower metal layer 1551 and a second upper metal layer 1553.

The first upper metal layer 1583 includes a doping unit or doping opening for exposing the first lower metal layer 1581. The doping unit can be formed in various shapes, as shown in FIGS. 4 to 7.

FIG. 4 to FIG. 7 show top plan views of a first upper metal layer including a doping unit or doping opening according to another embodiment.

Figure 4:
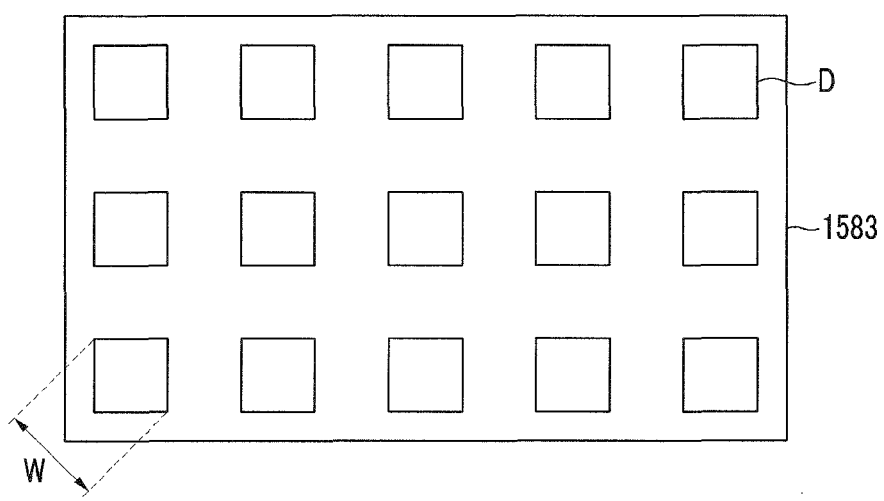
FIG. 4 to FIG. 7 show top plan views of a first upper metal layer including a doping unit according to another embodiment.

In detail, as shown in FIG. 4, the doping unit or doping void (D) may be formed as a plurality of doping holes in the first upper metal layer 1583 having a substantially quadrangular shape. The doping holes may be formed to be circular or polygonal, and the diameter or width (which is a distance between two opposing edges or two opposing apexes of the circular or polygonal hole) of the doping hole is equal to or less than about 2 μm.

Figure 5:
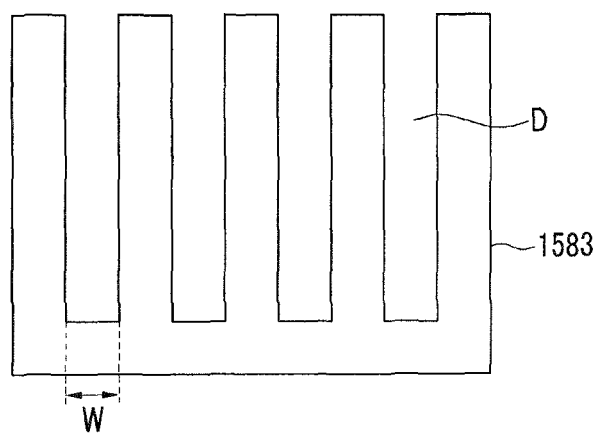
Figure 6:
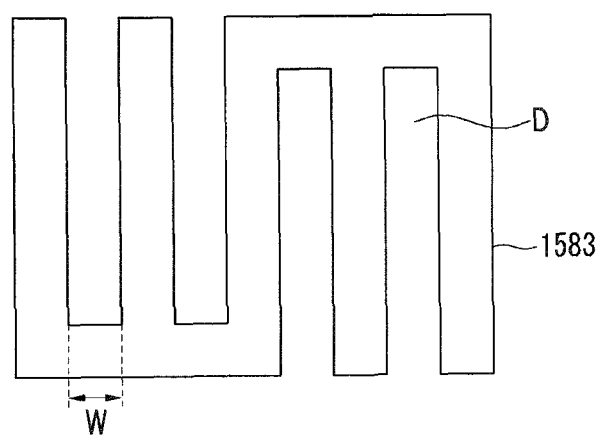

As shown in FIG. 5, the doping unit (D) may be formed as a plurality of doping cutouts or doping channels on the first upper metal layer 1583. When a plurality of doping cutouts are formed as shown in FIG. 5, the first upper metal layer 1583 may be formed to have a plurality of stick-shaped branches. Although the branches extend in the same direction in the embodiment shown in FIG. 5, they may extend in opposite directions as shown in FIG. 6. In this instance, the width (W) of the doping cutout is equal to or less than about 2 μm.

Figure 7:
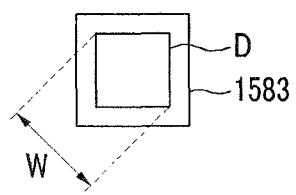
Figure 7:
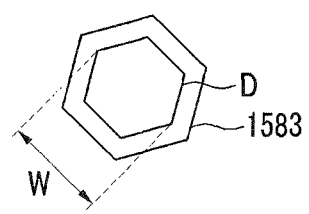
Figure 7:
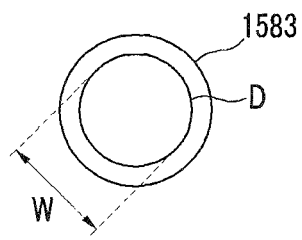

As shown in FIG. 7, the first upper metal layer 1583 may be formed as a circular or polygonal ring having a frame, and an internal hole of the ring may be used as the doping unit D. The diameter of the doping unit or the largest width (W) thereof is equal to or less than about 2 μm.

Referring to FIG. 3, the first lower metal layer 1581 and the second lower metal layer 1551 may be made of molybdenum or a molybdenum alloy, and the first upper metal layer 1583 and the second upper metal layer 1553 may be made of tungsten or a tungsten alloy. The first lower metal layer 1581 and the second lower metal layer 1551 may have a thickness of about 1000 Å or less, and the first upper metal layer 1583 and the second upper metal layer 1553 may have a thickness twice to four times the thickness of the first lower metal layer 1581 and the second lower metal layer 1551, that is, from about 2000 Å to about 4000 Å.

The first capacitor electrode 138 and the second capacitor electrode 158 form a capacitor 80 with the gate insulating layer 140 as a dielectric material.

An interlayer insulating layer 160 is disposed on the gate electrode 155 and the second capacitor electrode 158. Like the gate insulating layer 140, the interlayer insulating layer 160 may be made of tetraethyl orthosilicate (TEOS), silicon nitride, or silicon oxide.

The interlayer insulating layer 160 and the gate insulating layer 140 have a source contact hole 167 for exposing the source region 1357 and a drain contact hole 166 for exposing the drain region 1356.

A source electrode 177 and a drain electrode 176 are disposed on the interlayer insulating layer 160. The source electrode 177 and the drain electrode 176 are connected to the source region 1357 and drain region 1356 through the source contact hole 167 and the drain electrode hole 166.

A capacitor electrode (not shown) may be disposed on the interlayer insulating layer 160. The capacitor electrode may overlap with the first capacitor electrode 138 or the second capacitor electrode 158 to increase capacitance.

A planarization layer 180 is formed to be a single layer or multiple layers including at least one of a polyacrylate resin, an epoxy resin, a phenolic resin, a polyamide resin, a polyimide resin, an unsaturated polyester resin, a polyphenylene ether resin, polyphenylene sulfide, and benzocyclobutene (BCB).

A pixel electrode 710 and a pixel defining layer 190 of the organic light emitting diode 70 are disposed on the planarization layer 180.

The pixel electrode 710 is connected to the drain electrode 176 through an anode contact hole 186 of the planarization layer 180 to function as an anode of the organic light emitting diode. The pixel electrode 710 may be connected to the source (not shown).

The pixel defining layer 190 includes an opening 195 that exposes the pixel electrode 710. The pixel defining layer 190 may be made of a resin such as a polyacrylate resin or a polyimide resin, or of an inorganic material such as silica.

An organic light emission layer 720 is disposed in the opening 195 of the pixel defining layer 190.

The organic light emission layer 720 is formed with multiple sub-layers including at least one of a light emission layer, a hole injection layer (HIL), a hole transport layer (HTL), an electron transport layer (ETL), and an electron injection layer (EIL).

When the organic light emission layer 720 includes all of them, the hole injection layer (HIL) is disposed on the pixel electrode 710 which is the anode, and then the hole transport layer (HTL), the light emission layer, the electron transport layer (ETL), and the electron injection layer (EIL) are sequentially stacked on it.

A common electrode 730 is disposed on the pixel defining layer 190 and the organic light emission layer 720.

The common electrode 730 functions as a cathode of the organic light emitting diode 70. Therefore, the pixel electrode 710, the organic light emission layer 720, and the common electrode 730 form the organic light emitting diode 70.

The organic light emitting diode (OLED) display may be of a front display type, a rear display type, or a front and rear display type according to the direction in which the organic light emitting diode 70 emits light.

When the organic light emitting diode (OLED) display 101 is a front display type of display, the pixel electrode 710 is formed as a reflective layer and the common electrode 730 is formed as a semi-transparent layer. On the other hand, when the organic light emitting diode (OLED) display 101 is a rear display type of display, the pixel electrode 710 is formed as a semi-transparent layer and the common electrode 730 is formed as a reflective layer. Further, when the organic light emitting diode (OLED) display 101 is a front and rear display type of display, the pixel electrode 710 and the common electrode 730 are formed as a transparent layer or a semi-transparent layer.

The reflective layer and the semi-transparent layer are made of at least one of magnesium (Mg), silver (Ag), gold (Au), calcium (Ca), lithium (Li), chromium (Cr), and aluminum (Al), or alloys thereof. The reflective layer and the semi-transparent layer are determined by thickness, and the semi-transparent layer may have a thickness equal to or less than about 200 nm. Transparency increases as thickness decreases, but if it is extremely thin, resistance increases.

The transparent layer is made of indium tin oxide (ITO), indium zinc oxide (IZO), zinc oxide (ZnO), or indium oxide (In2O3).

A method for manufacturing the above-described organic light emitting diode (OLED) display will now be described with reference to FIG. 8 to FIG. 13 and FIG. 3.

FIG. 8 to FIG. 13 show sequential cross-sectional views illustrating a method for manufacturing an organic light emitting diode (OLED) display according to an embodiment.

Figure 8:
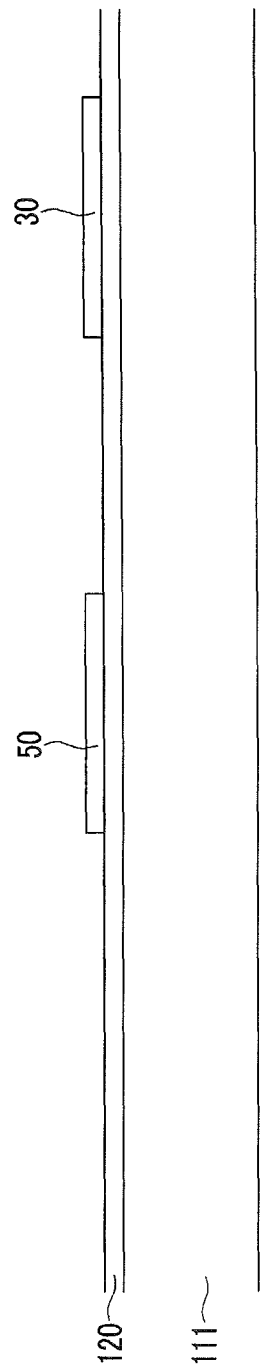
FIG. 8 to FIG. 13 show sequential cross-sectional views of a method for manufacturing an organic light emitting diode (OLED) display according to an embodiment.

As shown in FIG. 8, a buffer layer 120 is formed on a substrate 111. The buffer layer 120 may be made of silicon nitride or silicon oxide.

A polysilicon film is formed on the buffer layer 120 and then is patterned to form a first silicon pattern 30 and a second silicon pattern 50.

The polysilicon film is formed by forming an amorphous silicon layer and crystallizing the same. A dehydrogenation process for removing hydrogen atoms existing in the amorphous silicon layer can be further performed before the amorphous silicon layer is crystallized.

Figure 9:
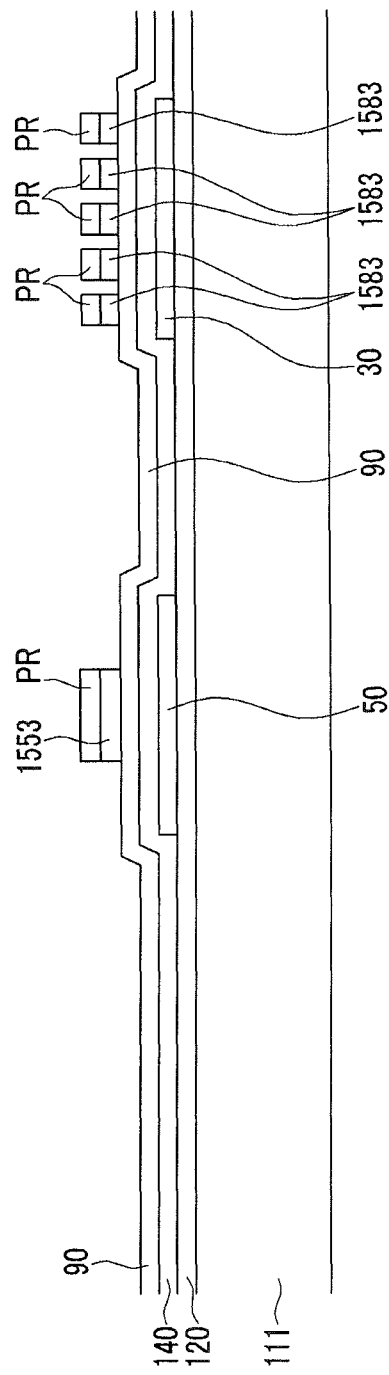

As shown in FIG. 9, a gate insulating layer 140 is formed on the first silicon pattern and the second silicon pattern. The gate insulating layer 140 may be made of silicon nitride or silicon oxide.

A first metal layer 90 and a second metal layer are stacked on the gate insulating layer 140, and then a photoresist pattern (PR) is formed on the second metal layer.

The second metal layer is dry etched by using the photoresist pattern (PR) which can function as a mask to form a first upper metal layer 1583 and a second upper metal layer 1553. The first upper metal layer 1583 includes a doping unit (D) exposing a first metal layer 90. In this instance, the width of the doping unit (D) is equal to or less than abut 2 μm.

Figure 10:
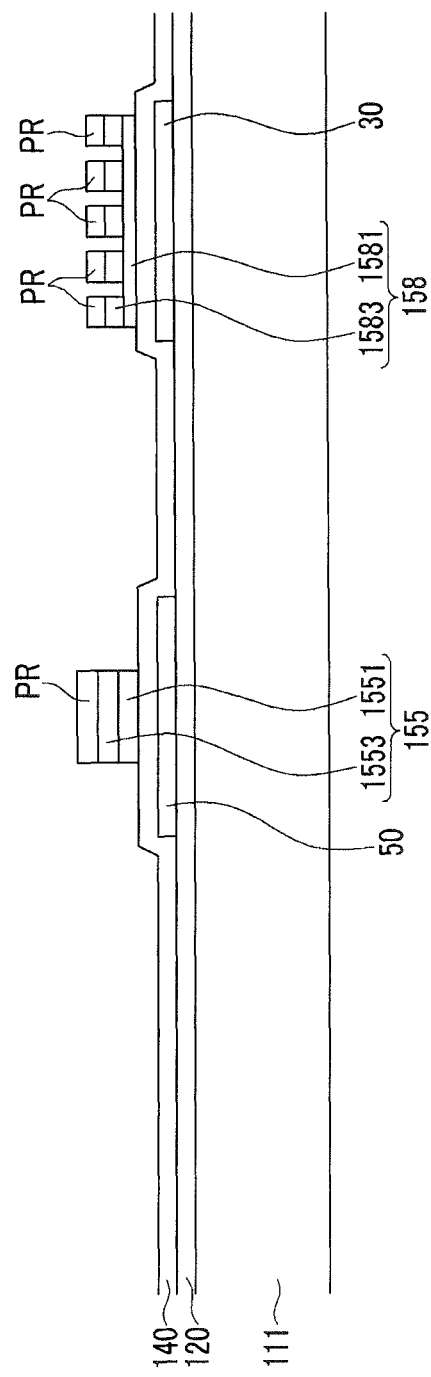

As shown in FIG. 10, the first metal layer is wet etched by using the photoresist pattern (PR) which functions as a mask to thus form a first lower metal layer 1581 and a second lower metal layer 1551. The first lower metal layer 1581 and the first upper metal layer 1583 form a second capacitor electrode 158. The second lower metal layer 1551 and the second upper metal layer 1553 form a gate electrode 155 of the transistor.

In the illustrated embodiment, the width of the doping unit (D) is equal to or less than about 2 μm so that the etchant cannot permeate into the doping unit sufficiently to reach the first metal layer 90 through the doping opening. Therefore, portions of the first metal layer 90 exposed through the doping unit are not etched although the portions of the first metal layer 90 are exposed through the doping unit. Thus, portions of the first metal layer are not covered by the photoresist pattern other than the portions of the first metal layer exposed through the doping openings are etched.

As the viscosity of the etchant becomes greater, it becomes more difficult for the etchant to permeate into the doping unit. However, when the viscosity of the etchant is extremely high, the first metal layer that is exposed outside the upper metal layers 1583 and 1551 may not be etched. Therefore, the viscosity of the etchant is preferably from about 13.6 cP to about 30 cP.

Figure 11:
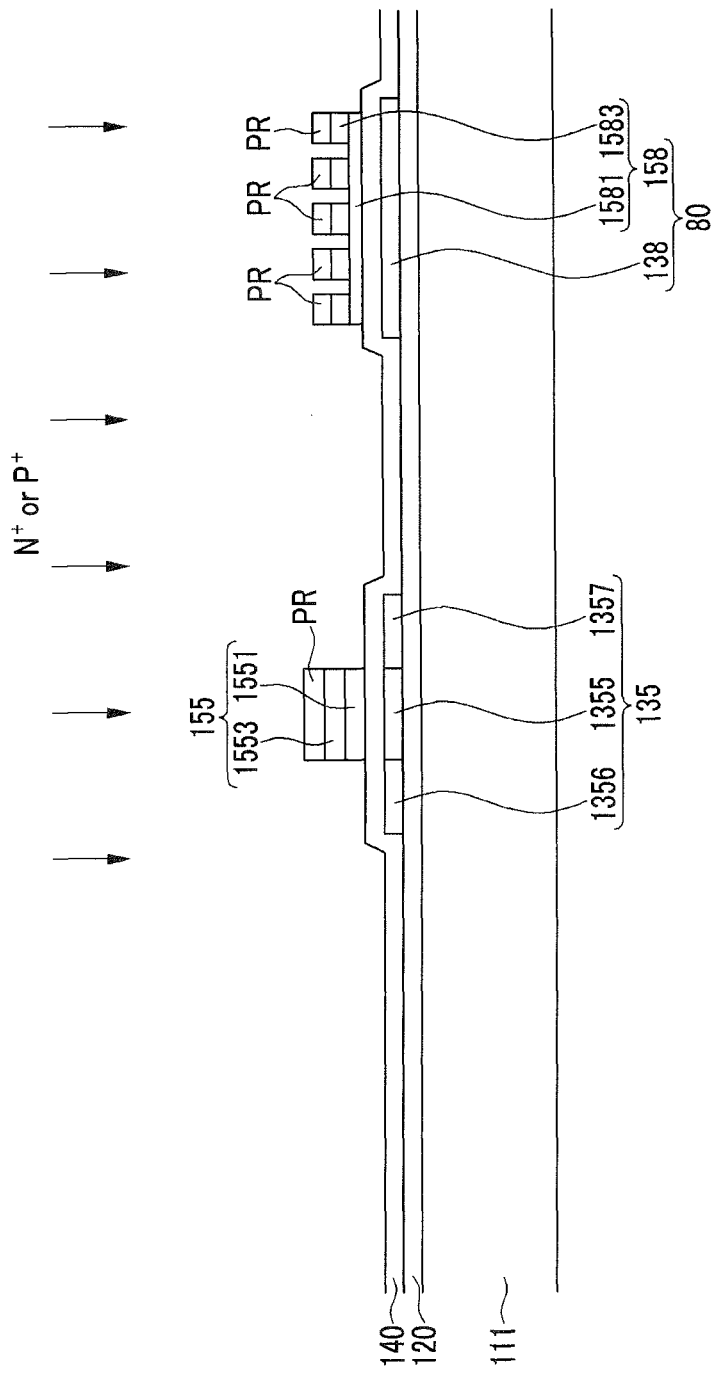

As shown in FIG. 11, conductive impurity ions are doped to the first silicon pattern and the second silicon pattern by using the photoresist pattern (PR) as a mask.

The conductive impurity ions are doped on the first silicon pattern 30 through the doping unit and the first silicon pattern 30 becomes the first capacitor electrode 138 having conductivity. In this instance, it is preferable that the thickness of the first metal layer is equal to or less than about 1000 Å so that the conductive impurity ions pass through the first lower metal layer to be injected into the first silicon pattern 30.

The second silicon pattern 50 is formed by stacking the second lower metal layer 1551 and the second upper metal layer 1553. Therefore, the impurity ions are doped on the second silicon pattern 50 exposed outside the second lower metal layer 1551 and the second upper metal layer 1553 to form a source region 1357 and a drain region 1356, respectively, and the second silicon pattern 50 overlapping with the second lower metal layer 1551 and provided between the source region 1357 and the drain region 1356 becomes a channel region 1355.

Alternatively, unlike in FIG. 11, the photoresist pattern (PR) may be removed and the gate electrode 155 and the second capacitor electrode 158 may be used as a mask to perform doping.

When the doping unit is formed and the width of the doping unit is small as described above, the doping can be simultaneously performed without an additional masking process for respectively doping the source and drain regions of the transistor and the lower electrode of the capacitor. Therefore, the number of masking processes can be reduced to simplify the organic light emitting diode (OLED) display manufacturing process.

When the doping process is performed by using the doping unit as described above, portions of the first capacitor electrode corresponding to the doping unit become conductive by the conductive impurity ions to thereby form a metal-insulator-metal (MIM) capacitor together with the first lower metal layer. The first silicon pattern to which no conductive impurity ions are doped configure a metal oxide semiconductor (MOS) capacitor together with the first lower metal layer.

When the doping process is performed by using the doping unit as described above, an MIM capacitor having higher charge efficiency than an MOS capacitor can be easily formed. Hence, the efficiency of the capacitor of the organic light emitting diode (OLED) display will be higher than that of an OLED display including an MOS capacitor.

Figure 12:
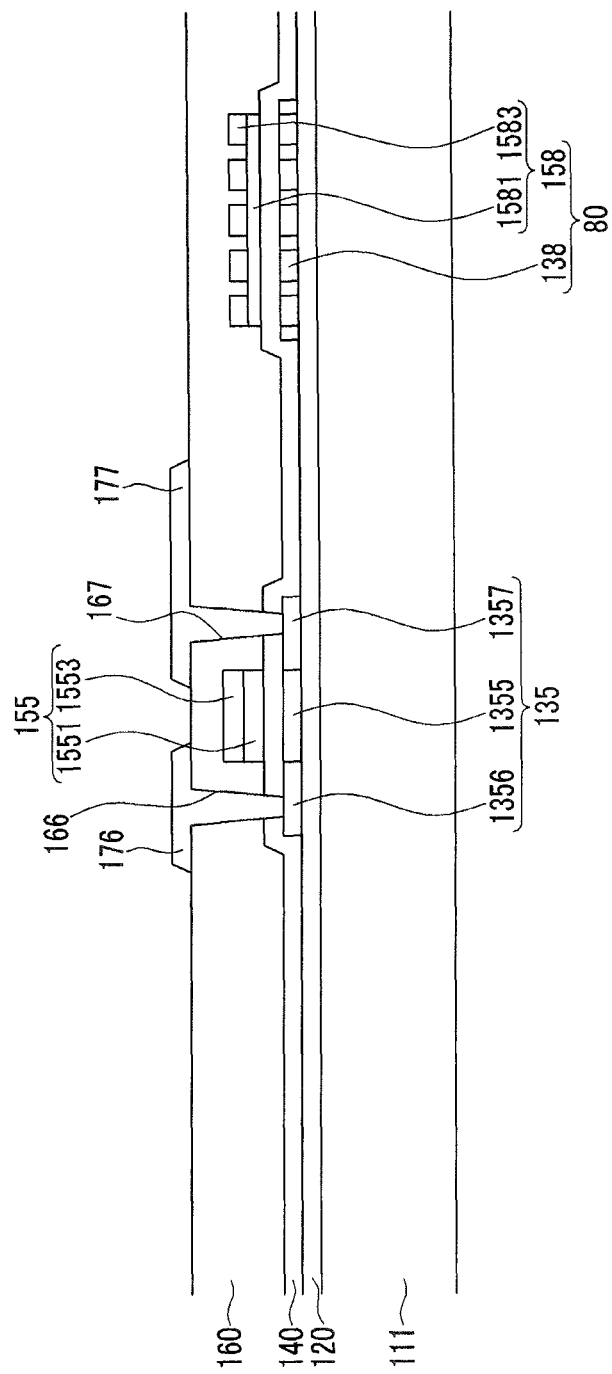

As shown in FIG. 12, the photoresist pattern is removed and then an interlayer insulating layer 160 is formed on the gate electrode 155 and the second capacitor electrode 158.

A photolithography process is performed to form a source contact hole 167 exposing the source region 1357 and a drain contact hole 166 exposing the drain region 1356 in the interlayer insulating layer 160.

A metal layer is formed on the interlayer insulating layer 160 and then is patterned to form a source electrode 177 connected to the source region 1357 through the source contact hole 167 and a drain electrode 176 connected to the drain region 1356 through the drain contact hole 166.

Figure 13:
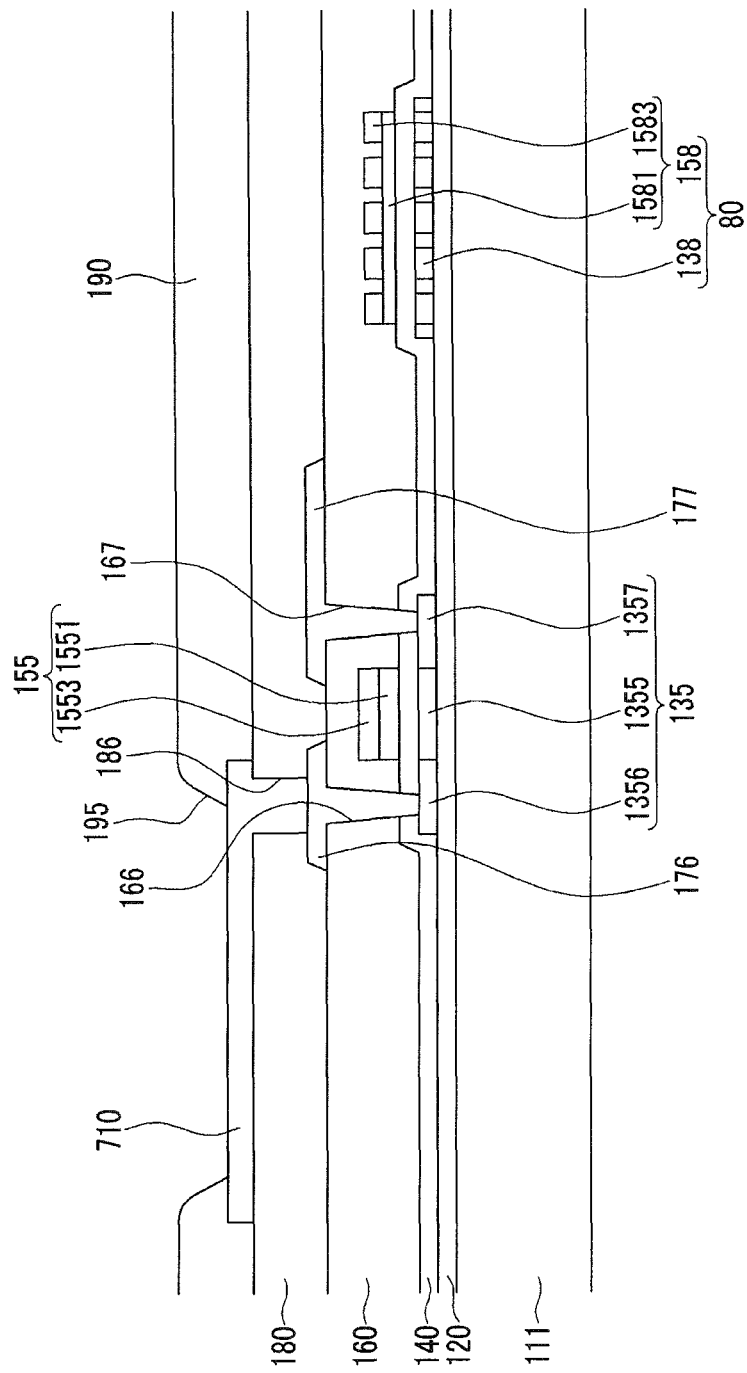

As shown in FIG. 13, a planarization layer 180 is formed on the drain electrode 176 and the source electrode 177 and the photolithography process is performed to form an anode contact hole 186 for exposing the drain electrode 176 in the planarization layer 180.

A metal layer is formed on the planarization layer 180 and is patterned to form a pixel electrode 710 connected to the drain electrode 176 through the anode contact hole 186.

A pixel defining layer 190 having an opening 195 that exposes the pixel electrode 710 is formed on the planarization layer 180.

As shown in FIG. 3, an organic light emission layer 720 is formed in the opening 195 of the pixel defining layer 190 and a common electrode 730 is formed on the organic light emission layer 720.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
   a substrate;
   a first capacitor electrode provided over the substrate and comprising polysilicon;
   an insulating layer provided over the first capacitor electrode; and
   a second capacitor electrode provided over the insulating layer such that the insulating layer is interposed between the first and second capacitor electrodes, the second capacitor electrode comprising a first upper metal layer and a first lower metal layer that overlaps the first capacitor electrode,
   wherein the first upper metal layer comprises a doping opening configured to expose at least a portion of the first lower metal layer.

2. The organic light emitting diode display of claim 1, wherein conductive impurity ions are doped to the first capacitor electrode in a region corresponding to the doping opening.

3. The organic light emitting diode display of claim 2, further comprising:
   a semiconductor provided over the substrate and comprising a source region, a drain region, and a channel region; and
   a gate electrode provided over the insulating layer overlapping with the channel region, and comprising a second lower metal layer and a second upper metal layer,
   wherein the second lower metal layer is made of the same material as the first lower metal layer, and
   wherein the second upper metal layer is made of the same material as the first upper metal layer.

4. The organic light emitting diode display of claim 3, wherein the conductive impurity ions are doped to the source region and the drain region.

5. The organic light emitting diode display of claim 3, further comprising:
   an interlayer insulating layer provided over the second capacitor electrode and the gate electrode;
   a source electrode and a drain electrode provided over the interlayer insulating layer and connected to the source region and the drain region;
   a planarization layer provided over the source electrode and the drain electrode;
   a pixel electrode provided over the planarization layer;
   a pixel defining layer having a pixel opening exposing the pixel electrode;
   an organic light emission layer provided in the pixel opening; and
   a common electrode provided over the organic light emission layer.

6. The organic light emitting diode display of claim 5, wherein the pixel electrode is connected to the source electrode or the drain electrode.

7. The organic light emitting diode display of claim 1, wherein the thickness of the first lower metal layer is equal to or less than about 1000 Å.

8. The organic light emitting diode display of claim 7, wherein the thickness of the first upper metal layer is twice to four times the thickness of the first lower metal layer.

9. The organic light emitting diode display of claim 7, wherein the width of the doping opening is equal to or less than about 2 μm.

10. The organic light emitting diode display of claim 9, wherein the doping opening has a circular or polygonal shape.

11. The organic light emitting diode display of claim 9, wherein the first upper metal layer comprises a plurality of stick-shaped branches, and
   wherein the doping opening comprises a channel that is provided between two neighboring branches.

12. The organic light emitting diode display of claim 9, wherein the first upper metal layer comprises a circular or polygonal ring which comprises the doping opening.

* * * * *